(12) United States Patent
Chen et al.

(10) Patent No.: US 9,480,183 B2
(45) Date of Patent: Oct. 25, 2016

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chiang-Hsueh Fang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 174 days.

(21) Appl. No.: 14/446,636

(22) Filed: Jul. 30, 2014

(65) Prior Publication Data

US 2016/0029791 A1 Feb. 4, 2016

(51) Int. Cl.
*H05K 7/18* (2006.01)
*H05K 7/14* (2006.01)

(52) U.S. Cl.
CPC ............ *H05K 7/183* (2013.01); *H05K 7/1489* (2013.01)

(58) Field of Classification Search
CPC .... A47B 88/044; A47B 88/10; A47B 88/16; A47B 88/14; A47B 88/04; A47B 88/0407; A47B 88/0418; A47B 2210/0059; A47B 2210/0032; A47B 2210/0081; A47B 2210/0016; H05K 7/1489; H05K 7/183
USPC ................ 312/333, 334.44, 334.46, 334.47
See application file for complete search history.

(56) References Cited

U.S. PATENT DOCUMENTS

| | | | |
|---|---|---|---|
| 6,238,031 B1 * | 5/2001 | Weng ................ | A47B 88/0407 312/333 |
| 6,715,851 B1 * | 4/2004 | Yang ..................... | A47B 88/10 312/334.46 |
| 6,796,625 B2 * | 9/2004 | Lauchner ............. | H05K 5/0013 312/333 |
| 6,997,611 B2 | 2/2006 | Chen et al. | |
| 7,118,277 B2 * | 10/2006 | Chen ..................... | A47B 88/04 312/334.46 |
| 7,357,362 B2 | 4/2008 | Yang et al. | |
| 7,364,244 B2 * | 4/2008 | Sandoval ............. | H05K 7/1411 312/333 |
| 7,552,899 B2 * | 6/2009 | Chen .................... | A47B 88/044 211/26 |
| 7,604,308 B2 * | 10/2009 | Tseng .................... | A47B 88/10 312/333 |
| 7,753,460 B2 * | 7/2010 | Peng ..................... | A47B 88/10 312/334.46 |
| 7,857,403 B2 * | 12/2010 | Chen .................... | A47B 88/10 312/333 |
| 8,328,300 B2 * | 12/2012 | Yu ....................... | A47B 88/044 312/333 |
| 8,353,494 B2 * | 1/2013 | Peng ................... | A47B 88/044 211/192 |
| 8,371,454 B2 | 2/2013 | Chen et al. | |
| 8,550,416 B2 | 10/2013 | Yu et al. | |
| 2010/0072153 A1 * | 3/2010 | Chen .................... | A47B 88/044 211/183 |
| 2011/0290746 A1 * | 12/2011 | Lu ........................ | H05K 7/1489 211/26 |
| 2013/0016929 A1 * | 1/2013 | Fan ...................... | H05K 7/1489 384/35 |

* cited by examiner

*Primary Examiner* — Patrick Hawn
(74) *Attorney, Agent, or Firm* — Rosenberg, Klein & Lee

(57) ABSTRACT

A slide rail assembly comprising a first rail, a second rail, and an engaging member, wherein the first rail is connected to the side plate of the bracket assembly; the second rail is longitudinally and movably connected to the first rail; and the engaging member is connected to the second rail and comprising a contact portion, wherein when the second rail is pulled and moved along a direction with respect to the first rail to a predetermined position, the blocking portion of the arm member blocks the contact portion of the engaging member so that the second rail is blocked at the predetermined position.

15 Claims, 8 Drawing Sheets

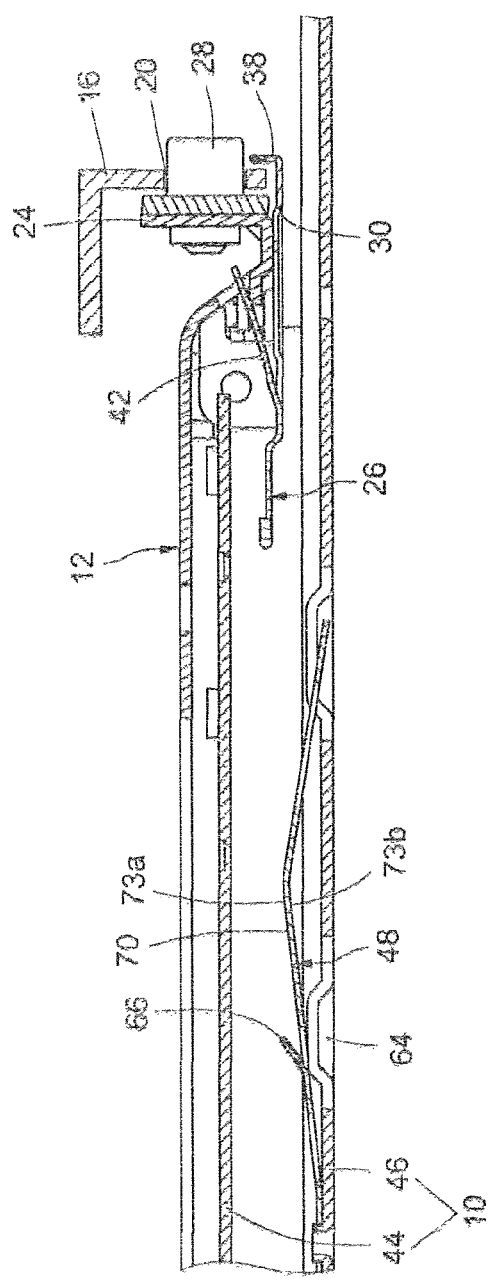
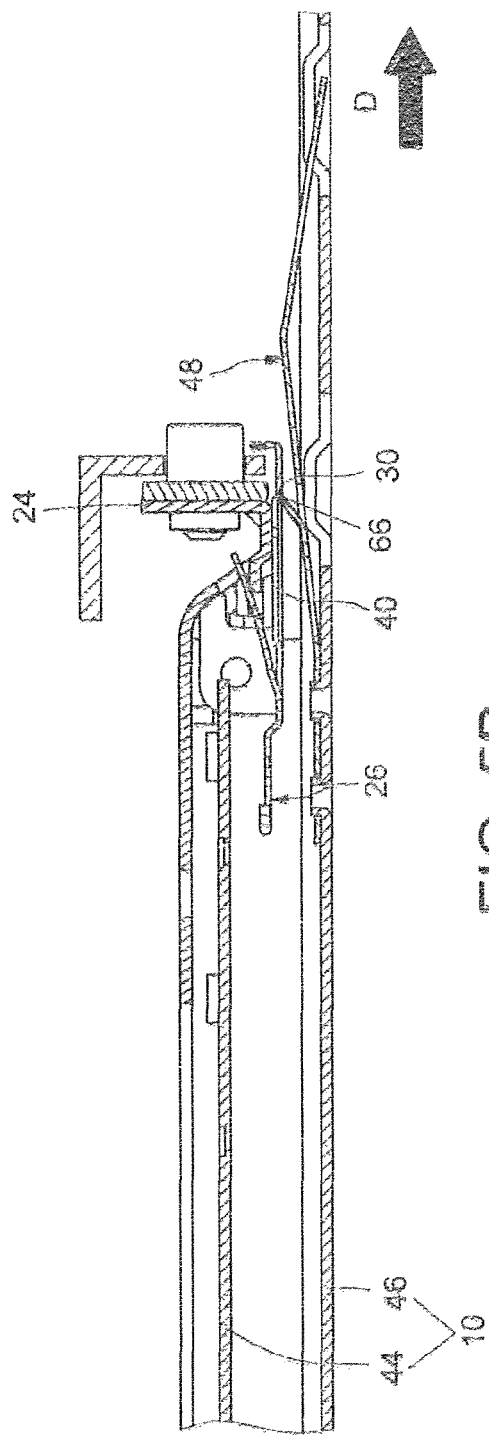
FIG. 5A
FIG. 5B

SLIDE RAIL ASSEMBLY

FIELD OF THE INVENTION

The invention relates to a slide rail assembly, and more particularly, to a slide rail assembly ensuring that one rail of the slide rail assembly does not dislocate from the other rail when being pulled and moved with respect to the other rail to a predetermined position.

BACKGROUND OF THE INVENTION

Generally speaking, slide rail assemblies are respectively configured on the two corresponding sides of a server chassis for rack server systems. By means of a bracket assembly connected with the slide rail assembly, the slide rail assembly is correspondingly mounted on the rack so that the chassis may be mounted on the rack.

U.S. Pat. No. 8,371,454 B2 disclosed a bracket assembly for a rack. It may be understood from the description and drawings (e.g. FIG. 8) that when a user assembles the bracket components to the post 86 of the rack 84, the user may penetrate the mounting member 32 of the end plate 14 of the bracket 10 through the post hole 88 of the rack 84, and by pressing the elastic leg 42 of the arm member 40 against the base 30, the fastening arm 44 of the arm member 40 retains an elastic force relative to the elastic leg 42 so that the fastening portion 46 of the fastening arm 44 retains elastic force and blocks in front of the rack 84 to ensure that the bracket components do not dislocate from the rack 84.

Furthermore, although conventional slide rail assemblies may also have engaging mechanisms configured between the two corresponding rails so as to provide a protection mechanism, by which a rail may be blocked at a predetermined position and not be dislocated from the other rail when the rail is moved longitudinally with respect to the other rail, the structural design of the engaging mechanism is usually over-complicated and the operations to disable the protection mechanism are inconvenient for the user.

Therefore, the providing of a product that has a simple structure and is convenient for users to operate has been a crucial topic of development and design.

SUMMARY OF THE INVENTION

The present invention is a slide rail assembly that ensures that one rail of the slide rail assembly does not dislocate from the other rail when being pulled and moved with respect to the other rail to a predetermined position.

An aspect of the invention provides a slide rail assembly, mounted to a rack by means of at least one bracket assembly, wherein the rack comprises a post hole and the bracket assembly comprises a side plate, an end plate bending from the side plate, an arm member movably connected to the side plate and comprising a blocking portion, and a mounting member connected to the end plate and mounted to the post hole of the rack. The slide rail assembly comprises: a first rail, connected to the side plate of the bracket assembly; a second rail, longitudinally and movably connected to the first rail; and an engaging member, connected to the second rail and comprising a contact portion, wherein when the second rail is pulled and moved along a direction with respect to the first rail to a predetermined position, the blocking portion of the arm member blocks the contact portion of the engaging member so that the second rail is blocked at the predetermined position.

Preferably, the arm member of the bracket assembly further comprises a first arm section and a second and section bending from the first arm section, wherein the first arm section comprises the blocking portion and the second arm section extends beyond the rack by a distance and faces the rack.

Preferably, the side plate of the bracket assembly comprises a base, wherein the bracket assembly further comprises a connection member, and wherein the connection member pivotally connects the arm member to the base of the side plate.

Preferably, the location of the blocking portion of the bracket assembly extends beyond the end plate by a distance.

Preferably, the first rail comprises an end, wherein the side plate of the bracket assembly is connected to the end of the first rail.

Preferably, the engaging member further comprises a base plate connected to the second rail and an inclining portion bending from the base plate, wherein the contact portion is located on the inclining portion, and wherein when the second rail is blocked at the predetermined position, the inclining portion is able to be pressed to separate the contact portion of the engaging member from the blocking portion of the arm member. The contact portion comprises a slant corresponding to the arm member, wherein when the second rail is moved along an opposite direction with respect to the first rail and drives the slant to contact the arm member, the inclining portion of the engaging member is pressed so that the contact portion of the engaging member can pass the arm member. The second rail comprises a rail hole and a hole edge adjacent to the rail hole, wherein the engaging member further comprises a supporting portion connected to the inclining portion and bent towards the second rail, and wherein the supporting portion comprises a blocking wing penetrating the rail hole and blocked by the hole edge.

Preferably, the arm member further comprises an arm hole, wherein the blocking, portion is an edge adjacent to the arm hole, wherein the contact portion of the engaging member is a protrusion, and wherein when the second rail is pulled and moved along the direction with respect to the first rail to the predetermined position, the protrusion of the engaging member is located at the arm hole of the arm member and is blocked by the edge of the arm member to block the second rail at the predetermined position.

Another aspect of the invention provides a slide rail assembly, mounted to a rack by means of at least one bracket assembly, wherein the rack comprises a post hole and the bracket assembly comprises a side plate, an end plate bending from the side plate, and a mounting member connected to the end plate and mounted to the post hole of the rack, the slide rail assembly comprising: a first rail, connected to the side plate of the bracket assembly and comprising an end: a second rail longitudinally and movably connected to the first rail; an arm member, movably connected to the end of the first rail and comprising a blocking portion; and an engaging member, connected to the second rail and comprising a contact portion, wherein when the second rail is pulled and moved along a direction with respect to the first rail to a predetermined position, the blocking portion of the arm member blocks the contact portion of the engaging member so that the second rail is blocked at the predetermined position.

Preferably, the first rail comprises a base, wherein a connection member pivotally connects the arm member to the base of the first rail.

Another aspect of the invention provides a slide rail assembly for a bracket assembly, wherein the bracket assembly comprises a side plate and an arm member, the arm member connected to the side plate and comprising a blocking portion, the slide rail assembly comprising: a first rail, connected to the side plate of the bracket assembly; a second rail, longitudinally and movably connected to the first rail; and an engaging member, connected to the second rail and comprising a contact portion, wherein when the second rail is pulled and moved along a direction with respect to the first rail to a predetermined position, the blocking portion of the arm member blocks the contact portion of the engaging member so that the second rail is blocked at the predetermined position.

Preferably, the side plate of the bracket assembly comprises a base, wherein the bracket assembly further comprises a connection member, and wherein the connection member pivotally connects the arm member to the base of the side plate.

Preferably, the bracket assembly further comprises an end plate bending from the side plate, and the location of the blocking portion of the bracket assembly extends beyond the end plate by a distance.

Preferably, the first rail comprises an end, wherein the side plate of the bracket assembly is connected to the end of the first rail.

Preferably, the engaging member further comprises a base plate connected to the second rail and an inclining portion bending from the base plate, wherein the contact portion is located on the inclining portion, and wherein when the second rail is blocked at the predetermined position, the contact portion of the engaging member is no longer blocked by the blocking portion of the arm member once the inclining portion is pressed. The contact portion comprises a slant corresponding to the arm member, wherein when the second rail is moved along an opposite direction with respect to the first rail and drives the slant to contact the arm member, the inclining portion of the engaging member is pressed so that the contact portion of the engaging member can pass the arm member. The second rail comprises a rail hole and a hole edge adjacent to the rail hole, wherein the engaging member further comprises a supporting portion connected to the inclining portion and bent towards the second rail, and wherein the supporting portion comprises a blocking wing penetrating the rail hole and blocked by the hole edge.

Preferably, the arm member further comprises an arm hole, wherein the blocking portion is an edge adjacent to the arm hole, wherein the contact portion of the engaging member is a protrusion, and wherein when the second rail is pulled and moved along the direction with respect to the first rail to the predetermined position, the protrusion of the engaging member is located at the arm hole of the and member and is blocked by the edge of the arm member to block the second rail at the predetermined position.

A feature of the embodiments of invention is that the blocking portion of the arm member blocks the contact portion of the engaging member so that the second rail is blocked at a predetermined position and does not dislocate from the first rail when the second rail of the slide rail assembly is pulled and moved along the direction with respect to the first rail to the predetermined position.

BRIEF DESCRIPTION OF THE DRAWINGS

FIG. 5A shows a schematic of the slide rail assembly mounted to the rack by means of at least one bracket assembly before the second rail moves to a predetermined position according to an embodiment of the present invention;

FIG. 5B shows a schematic of FIG. 5A after the second rail is pulled and moved to the predetermined position;

DETAILED DESCRIPTION OF THE INVENTION

The structures, features, advantages, and purposes of the present invention may be more fully understood by the subsequent detailed description and examples with references made to the accompanying drawings.

Figure 1:
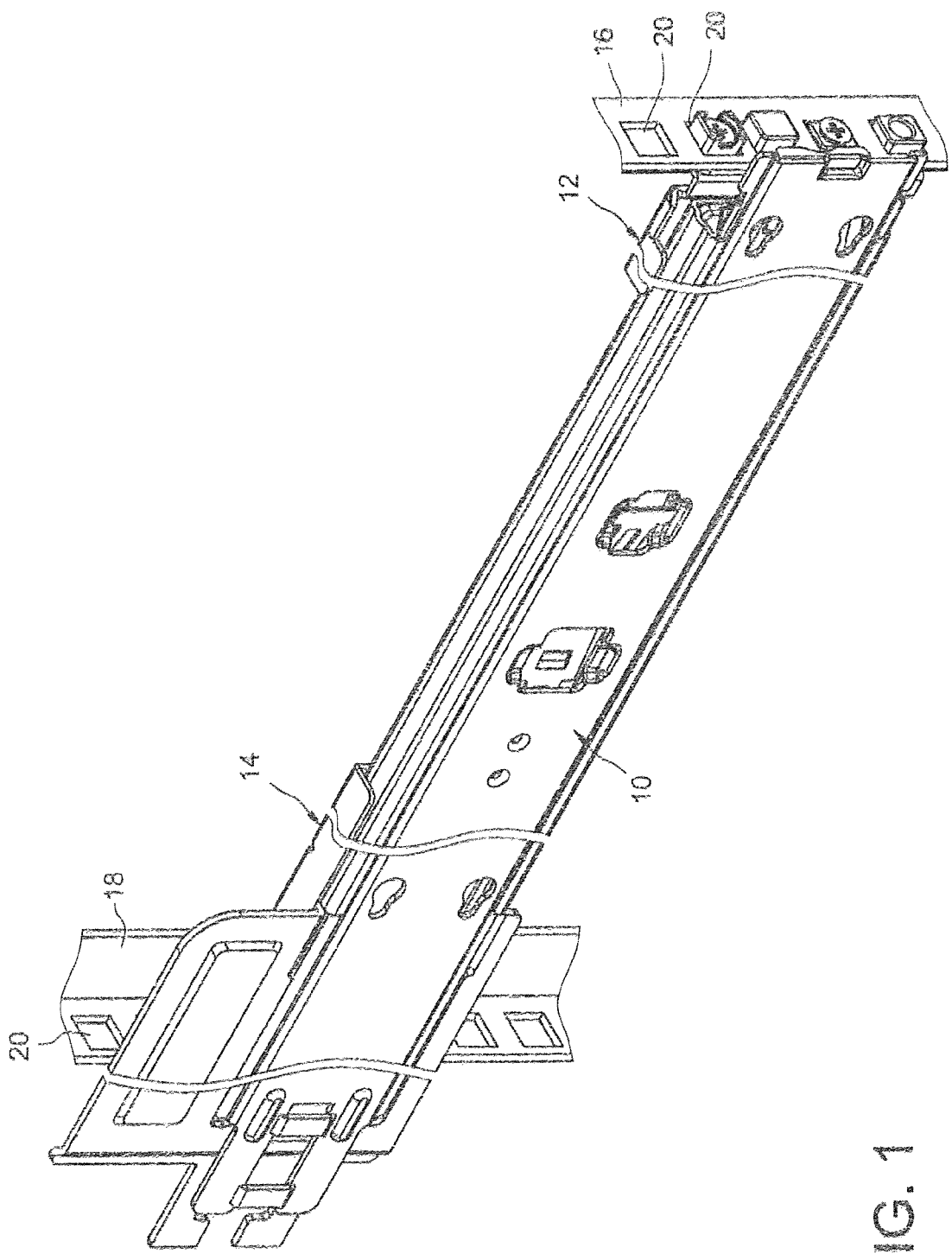
FIG. 1 shows a perspective view of a slide rail assembly mounted to a rack by means of at least one bracket assembly according to an embodiment of the present invention.

FIG. 1 shows a slide rail assembly 10 mounted to a rack by means of at least one bracket assembly according to an embodiment of the present invention. The two opposite ends of the slide rail assembly 10 are mounted to a first post 16 and a second post 18 of the rack by means of a first bracket assembly 12 and a second bracket assembly 14, respectively. The first post 16 and the second post 18 each comprises a plurality of post holes 20, wherein the plurality of post holes 20 may be square holes, circular holes, or holes of other shapes. Square holes are used here for an example, but the present invention is not limited thereto. Since the assembled configuration of the second bracket assembly 14 and the second post 18 is generally the same as that of the first bracket assembly 12 and the first post 16, the following descriptions shall only be made for the assembled configuration of the first bracket assembly 12 and the first post 16.

Figure 2:
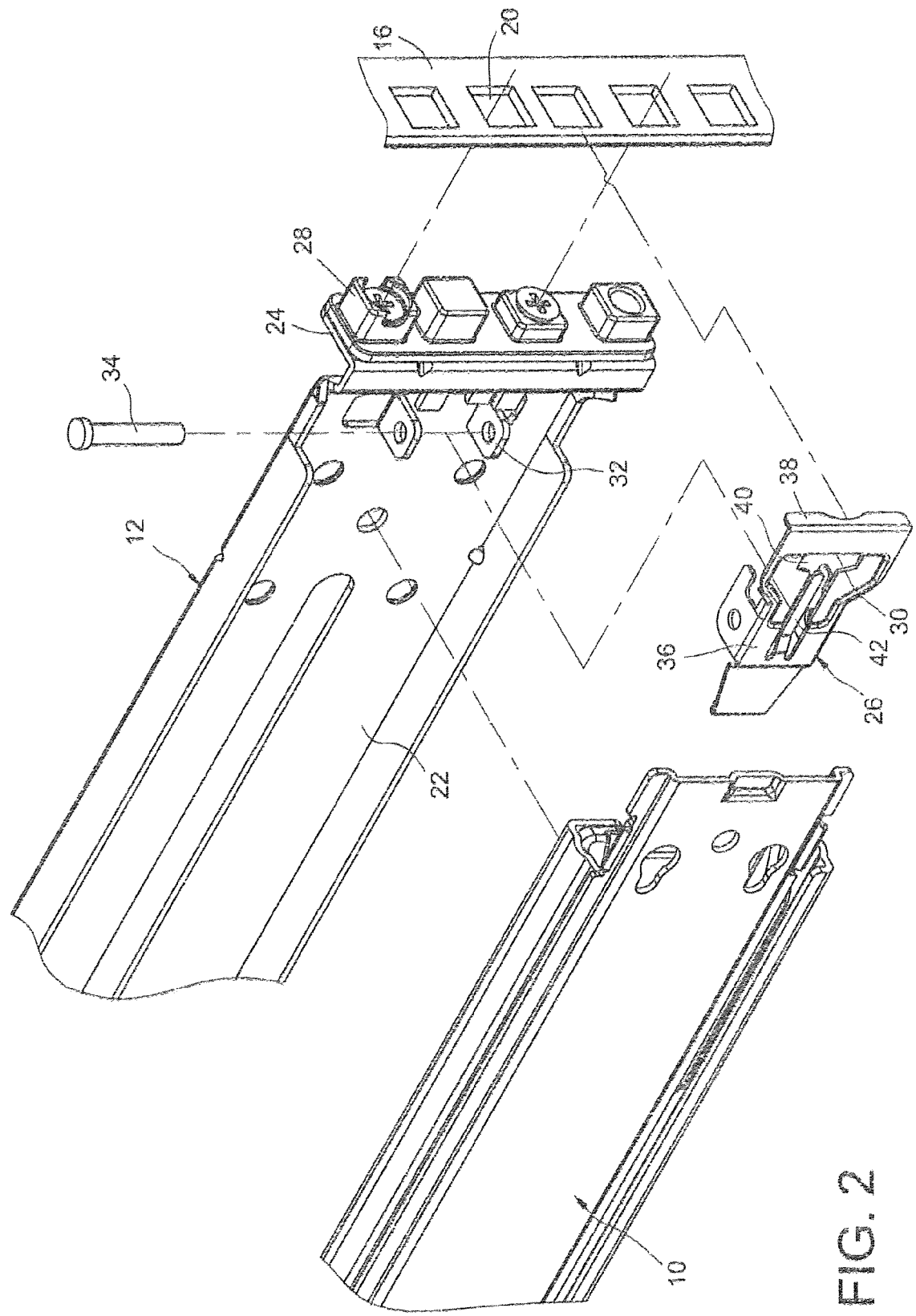
FIG. 2 is an exploded view of the slide rail assembly mounted to the rack by means of the bracket assembly according to an embodiment of the present invention.
Figure 3:
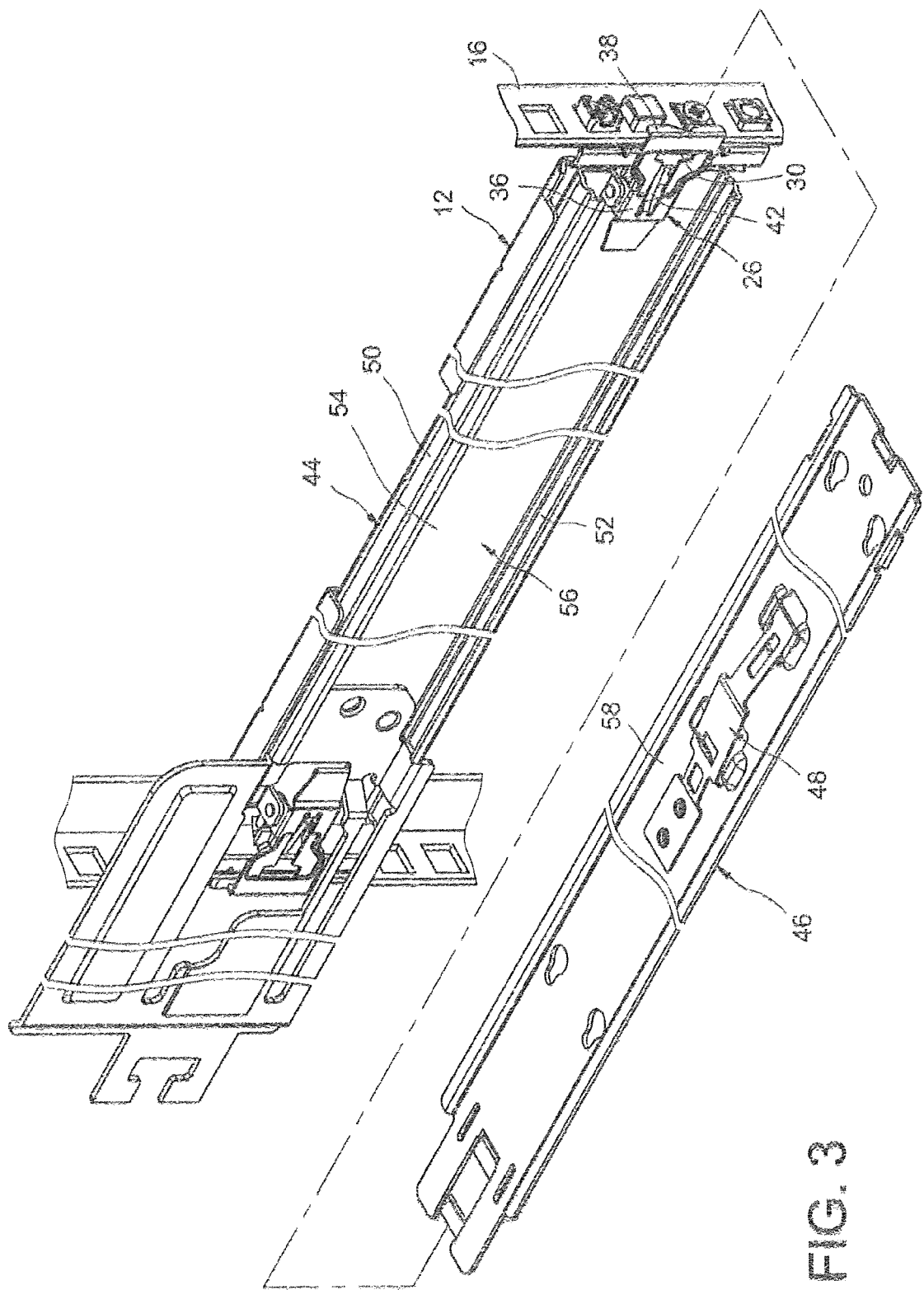
FIG 3 is an exploded view of a second rail and a first rail of the slide rail assembly of FIG. 1.

As shown in FIG. 2 and FIG. 3, the first bracket assembly 12 comprises a side plate 22, an end plate 24, an arm member 26, and a mounting member 28. The end plate 24 bends from the side plate 22 and more particularly, the end plate 24 is substantially perpendicularly connected to the side plate 22. The mounting member 28 is connected to the and plate 24 and may be correspondingly mounted to the post hole 20 of the first post 16. The arm member 26 is connected (e.g., movably connected) to the side plate 22 and comprises a blocking portion 30.

In a preferred embodiment the side plate 22 of the first bracket assembly 12 comprises a base 32 laterally connected to the side plate 22, wherein the first bracket assembly 12 further comprises a connection member 34 pivotally connecting the arm member 26 to the base 32 of the side plate 22 so that the arm member 26 may be operated to rotate with reaped to the side plate 22.

Specifically, the arm member 26 further comprises a first arm section 36 and a second arm section 38. The second arm section 38 bends from the first arm section 36 and more particularly, the second arm section 38 is substantially perpendicular to the first arm section 36. The first arm section 36 comprises the blocking portion 30. Preferably, the first arm section 36 further comprises an arm hole 40, wherein the blocking portion 30 is an edge adjacent to the arm hole 40, and wherein the location of the blocking portion 30 extends beyond the end plate 24 by a distance when the arm member 26 is pivotally connected to the base 32 of the side plate 22. In addition, the arm member 26 further comprises an elastic portion 42 (such as an elastic leg) correspondingly pressing against a portion of the first bracket assembly 12 so that the elastic portion 42 provides an elastic force to the arm member 26. Preferably, the elastic portion 42 extends from the first arm section 36 of the arm member 26 so that the second arm section 38 of the arm member 26 remains correspondingly facing the end plate 24 by means of the elastic force and is located in front of the first post 16 by a distance when the first bracket assembly 12 is mounted to the first post 16 (as shown in FIG. 3).

The slide rail assembly 10 comprises a first rail 44, a second rail 46, and an engaging member 48.

The first rail 44 is connected to the side plate 22 of the tint bracket assembly 12. More particularly, the side plate 22 of the first bracket assembly 12 is connected to art end of the first rail 44 (such as a front end). The first rail 44 comprises an upper wall 50, a lower wall 52, and a side wall 54 extending between the upper wall 50 and the lower wall 52, wherein the upper wall 50, the lower wall 52, and the side wall 54 collectively define a longitudinal channel 56.

The second rail 46 corresponds to and is longitudinally and movably connected to the first rail 44, wherein the second rail 46 comprises a longitudinally extending body 58 corresponding to and longitudinally movable along the longitudinal channel 56 of the first rail 44.

Figure 4:
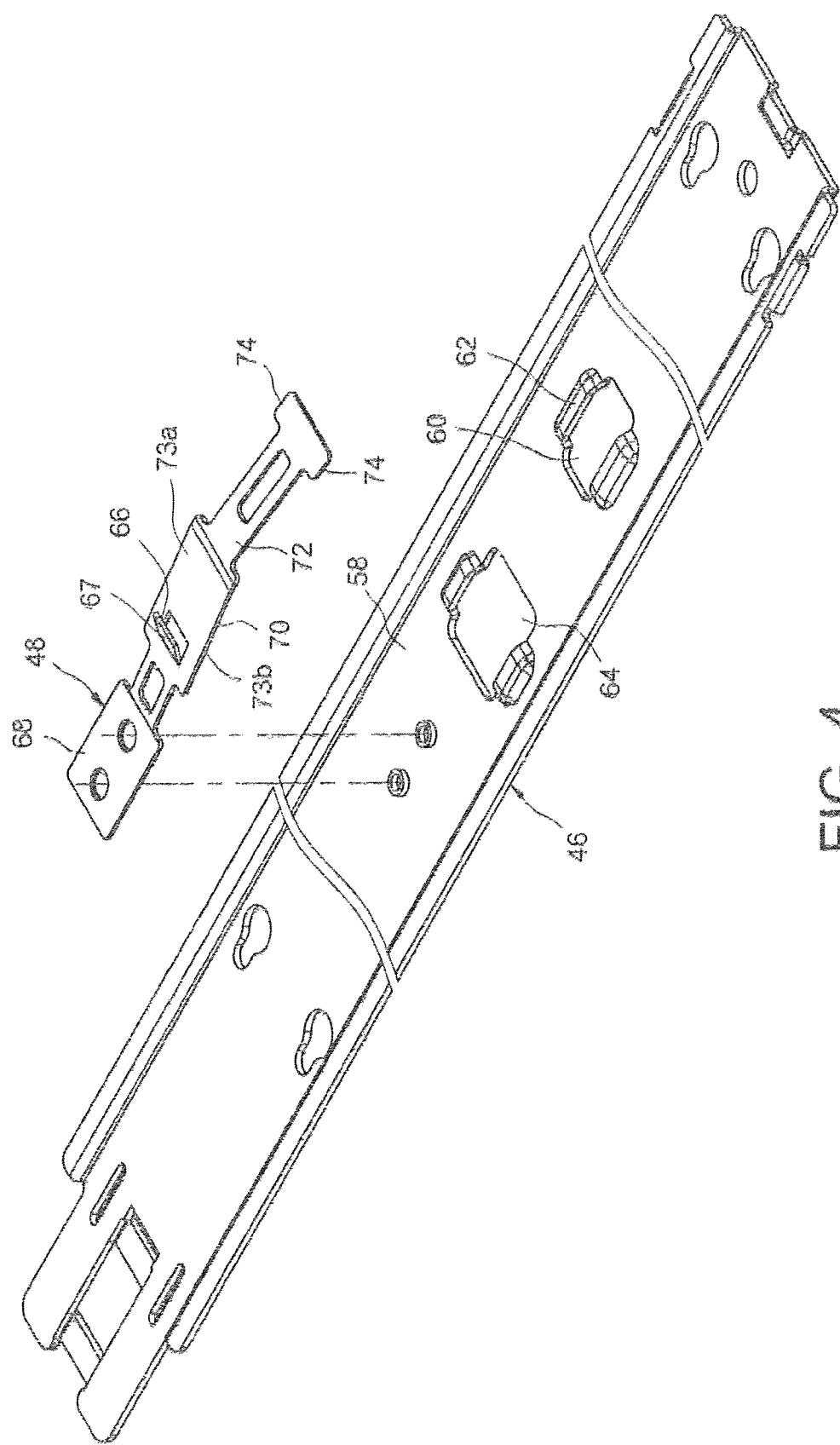
FIG. 4 is an exploded schematic of the second rail and an engaging member of FIG. 3.

As shown in FIG. 3 and FIG. 4, the longitudinally extending body 58 of the second rail 46 comprises a rail hole 60, a hole edge 62 adjacent to the rail hole 60, and another rail hole 64; the engaging member 48 is connected to the longitudinally extending body 58 of the second rail 46 and comprises a first side 73a and a second side 73b that are opposite to each other, wherein the second side 73b faces the longitudinally extending body 58 of the second rail 46. The engaging member 48 comprises a contact portion 66 on the first side 73a, wherein the contact portion 66 corresponds in configuration to the blocking portion 30 of the arm member 26 and more particularly, the contact portion 66 is a protrusion, but the present invention is not limited thereto. The contact portion 66 comprises a slant 67 and preferably, the engaging member 48 further comprises a base plate 68, an inclining portion 70, and a supporting portion 72.

The base plate 68 is connected to the longitudinally extending body 58 of the second rail 46; the inclining portion 70 bends from the base plate 68 and is elastic, wherein the contact portion 66 is located on the inclining portion 70; the supporting portion 72 is connected to the inclining portion 70 and bent towards the longitudinally extending body 58 of the second rail 46, wherein the supporting portion 72 comprises at least one blocking wing 74 penetrating the rail hole 60 of the second rail 46 and being blocked by the hole edge 62 to elastically confine the inclining portion 70 at a working position.

Moreover, the inclining portion 70 of the engaging member 48 corresponds in position to the another rail hole 64 of the longitudinally extending body 58 of the second rail 46 to be used by a user at discretion. For example, the user may push the second aide 73b of the engaging member 48 through the another rail hole 64 from one side of the second rail 46 (as shown in FIG. 5A) to adjust the extent of the inclining portion 70 bending from the base plate 68 so that the inclining portion 70 remains at the working position, but the function of the another rail hole 64 is not limited thereto.

As shown in FIG. 5A and FIG. 5B, after the slide rail assembly 10 is mounted to the post hole 20 of the first post 16 by means of the mounting member 28 of the bracket assembly (such as the first bracket assembly 12 and the second bracket assembly 14; FIG. 5A and FIG. 5B only show the first bracket assembly 12), the user may further operate the arm member 26 so that the second arm section 38 of the arm member 26 remains correspondingly blocking in front of the first post 16 by means of the elastic force provided by the elastic portion 42 (i.e., the second arm section 38 of the arm member 26 extends beyond the first post 16 by a distance and faces the first post 16), so as to prevent the slide rail assembly 10 from accidentally dislocating from the first post 16 by means of the blocking by the second arm section 38 of the arm member 26.

When the second rail 46 of the slide rail assembly 10 is pulled from a position (as in FIG. 5A) and moved along a direction D with respect to the first rail 44 to a predetermined position (as in FIG. 5B), the contact portion 66 (such as a protrusion) of the engaging member 48 is correspondingly located at the arm hole 40 of the arm member 26 and thereby blocked by the blocking portion 30 (such as an edge) of the arm member 26 so that the second rail 46 is blocked at the predetermined position with respect to the first rail 44. Accordingly, the second rail 46 is ensured not to be dislocated from the first rail 44. Therefore, when the second rail 46 is mounted with a chassis (such as a server chassis), the chassis is ensured not to be damaged due to the second rail 46 dislocating from the first rail 44.

In the embodiment, since the blocking portion 30 of the arm member 26 extends beyond the end plate 24 by a distance, the contact portion 66 of the engaging member 48 is not blocked by the edge of the end plate 24 when entering the arm hole 40 of the arm member 26, and the blocking portion 30 of the arm member 26 may indeed block the contact portion 66 of the engaging member 48. In addition, although the contact portion 66 of the engaging member 48 is a protrusion and the blocking portion 30 of the arm member 26 is an edge to block the protrusion of the engaging member 48, in another embodiment, the contact portion 66 of the engaging member 48 may be an edge and the blocking portion 30 of the arm member 26 may be a protrusion to block the edge of the engaging member 48 and the present invention is not limited thereto.

It should be noted that the second rail 46 may be directly pushed from the predetermined position (as in FIG. 5B) in a withdrawing direction (i.e., opposite to the direction D) so that the second rail 46 may be withdrawn from the predetermined position in the withdrawing direction with respect to the first rail 44 (as in FIG. 5A).

Figure 6A:
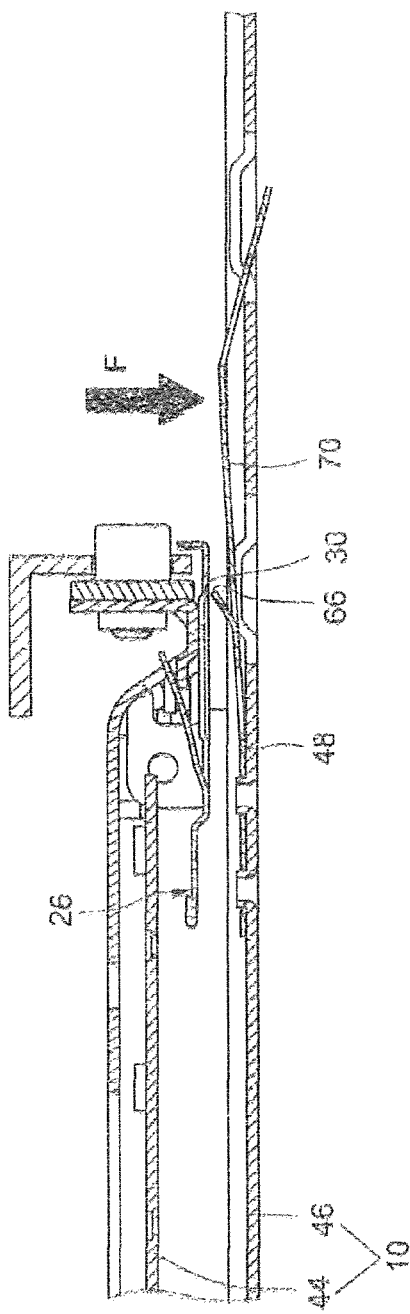
FIG. 6A shows a schematic of an inclining portion of the engaging member pressed so that a contact portion of the engaging member is not blocked by a blocking portion of an arm member after the second rail of the slide rail assembly is blocked at the predetermined position with respect to the first rail according to an embodiment of the present invention.
Figure 6B:
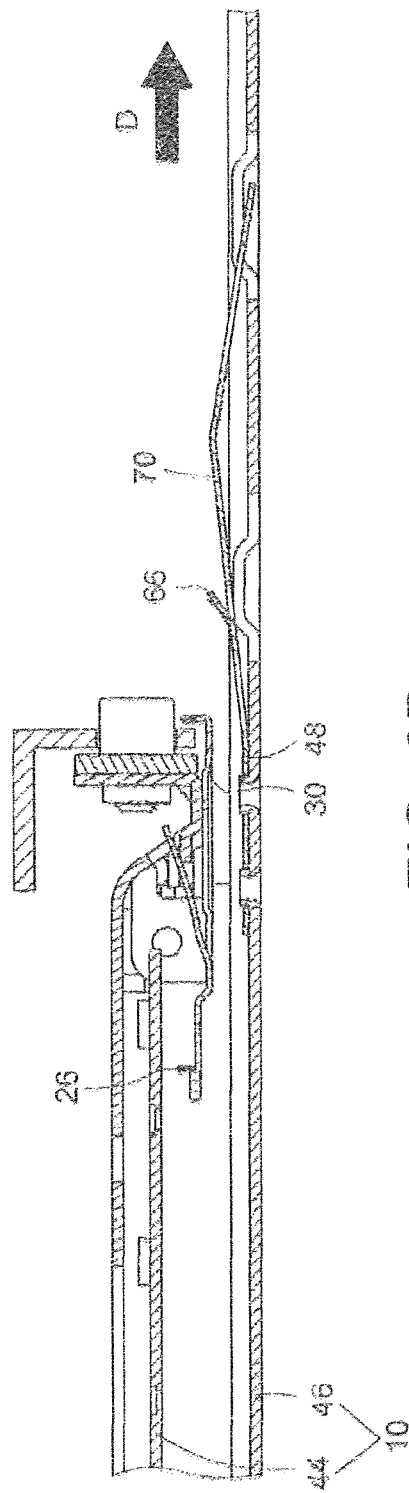
FIG. 6B shows a schematic of further continuing to pull and move the second rail along a direction after the contact portion of the engaging member is not blocked by the blocking portion of the arm member according To an embodiment of the present invention.

As shown in FIG. 6A and FIG. 6B, after the second rail 46 is blocked at the predetermined position, the user may directly apply a force F to press the inclining portion 70 of the engaging member 48 so that the contact portion 66 of the engaging member 48 may be dislocated from and no longer blocked by the blocking portion 30 of the arm member 26 (as in FIG. 6A), and the design of which may be more convenient for the user to operate; under such a condition, the user may further continue to pull and move the second rail 46 along the direction D (as in FIG. 6B) so that the second rail 46 is dislocated from the first rail 44. The user may carry out related maintenance of the slide rail assembly 10 according to tins feature, or may further carry out related replacement or maintenance of the chassis when a chassis is mounted on the second rail 46.

Figure 7:
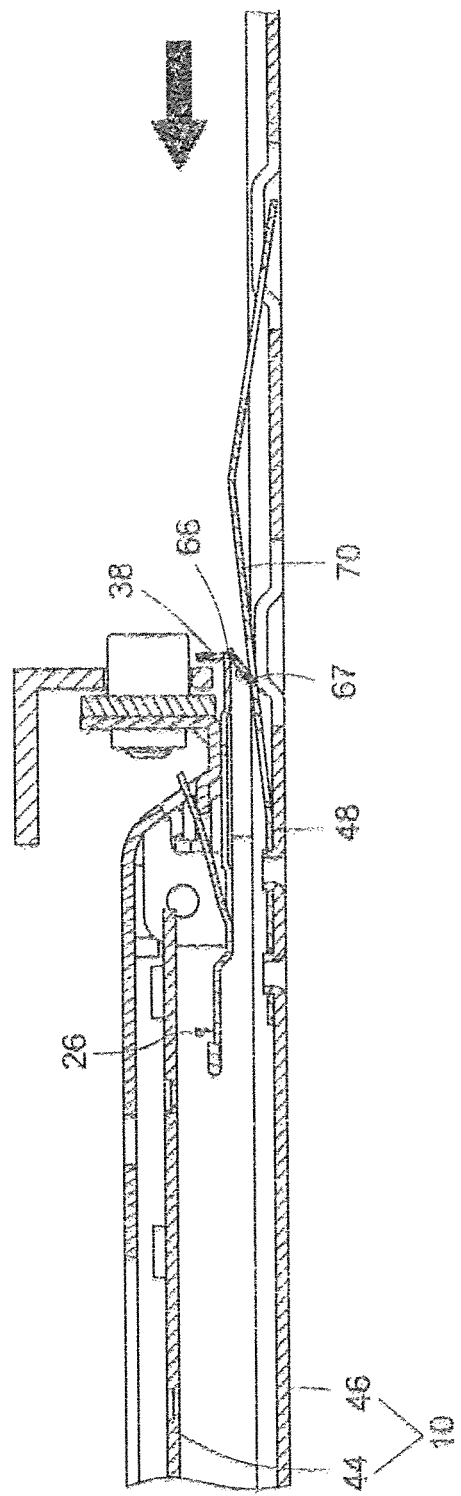
FIG. 7 shows a schematic of the second rail moving in a withdrawing direction according to an embodiment of the present invention.

When the second rail 46 is put back to the first rail 44 (as in FIG. 6B), the user may directly push the second rail 46 in the withdrawing direction (i.e. opposite to the direction D) and the slant 67 of the engaging member 48 may thereby be pressed against by the second arm section 38 of the arm member 26 during the withdrawing process (as in FIG. 7) so that the inclining portion 70 of the engaging member 48 is correspondingly pressed (as in FIG. 6A), and the contact portion 66 of the engaging member 48 may subsequently pass the second arm section 38 of the arm member 26. As such, the second rail 46 may be withdrawn with respect to the first rail 44.

Figure 8:
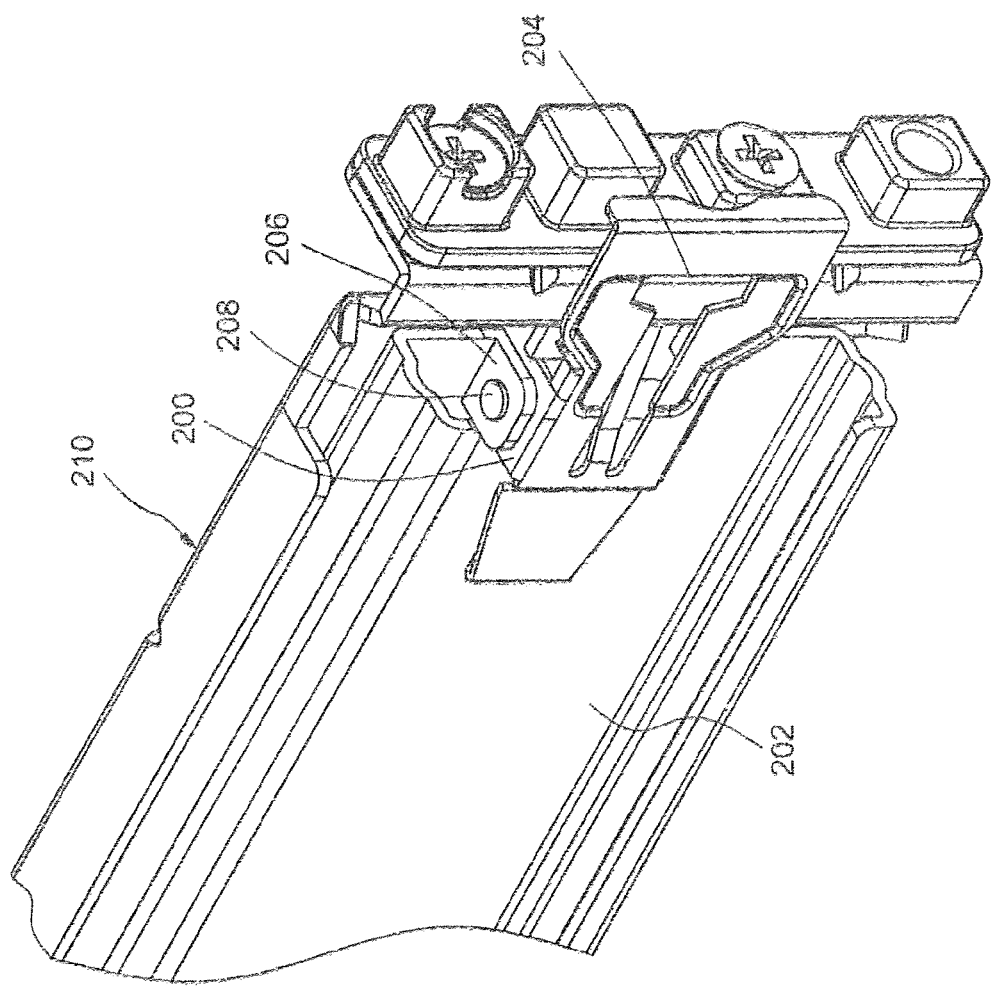
FIG. 8 shows a schematic of a slide rail assembly comprising an arm member according to another embodiment of the present invention.

FIG. 8 shows a slide rail assembly according to another embodiment of the present invention. The difference between this embodiment and the above embodiments is that an arm member may be configured at a first rail of the slide rail assembly.

Specifically, the slide rail assembly comprises an arm member 200 that is movably connected to an end of a first rail 202 (such as a front end) and comprises a blocking portion 204. Preferably, the first rail 202 comprises a base 206 configured in the vicinity of the end of the first rail 202, wherein a connection member 208 pivotally connects the arm member 200 to the base 206 of the first rail 202. By such a structural configuration, after the slide rail assembly is correspondingly mounted to a post of a rack by means of a bracket assembly 210, a blocking portion 204 of the arm member 200 blocks a contact portion of an engaging member so that a second rail (not shown) is blocked at a predetermined position to ensure that the second rail is not to dislocated from the first rail 202. The related operations and principles are described in above and will not be repeated here for brevity.

While the invention has been described by way of example and in terms of the previous embodiments, it is to be understood that the invention is not limited to the disclosed embodiments. Therefore, the scope of the appended claims should be accorded the broadest interpretation so as to encompass all such modifications and similar embodiments.

The invention claimed is:

1. A slide rail assembly, mounted to a rack by means of at least one bracket assembly, wherein the rack includes a post hole and the bracket assembly includes a side plate, an end plate bending from the side plate, an arm member movably connected to the side plate and including a blocking portion, and a mounting member connected to the end plate and mounted to the post hole of the rack, the slide rail assembly comprising:
a first rail, connected to the side plate of the bracket assembly;
a second rail, longitudinally and movably connected to the first rail; and
an engaging member, connected to the second rail and including a contact portion, wherein when the second rail is pulled and moved along a direction with respect to the first rail to a predetermined position, the blocking portion of the arm member blocks the contact portion of the engaging member so that the second rail is blocked at the predetermined position;
wherein the engaging member includes a base plate connected to the second rail and an inclining portion bending from the base plate, the contact portion being located on the inclining portion, and when the second rail is blocked at the predetermined position, the inclining portion being pressed to separate the contact portion of the engaging member from the blocking portion of the arm member;
wherein the second rail includes a rail hole and a hole edge adjacent to the rail hole, the engaging member further including a supporting portion connected to the inclining portion and bent towards the second rail, and the supporting portion including a blocking wing penetrating the rail hole and blocked by the hole edge.

2. The slide rail assembly as claimed in claim 1, wherein the arm member of the bracket assembly further includes a first arm section and a second arm section bending from the first arm section, and wherein the first arm section includes the blocking portion and the second arm section extends beyond the rack by a distance and faces the rack.

3. The slide rail assembly as claimed in claim 1, wherein the side plate of the bracket assembly includes a base, wherein the bracket assembly includes a connection member, and wherein the connection member pivotally connects the arm member to the base of the side plate.

4. The slide rail assembly as claimed in claim 1, wherein the location of the blocking portion of the bracket assembly extends beyond the end plate by a distance.

5. The slide rail assembly as claimed in claim 1, wherein the first rail includes an end, and wherein the side plate of the bracket assembly is connected to the end of the first rail.

6. The slide rail assembly as claimed in claim 1, wherein a section of the contact portion has a slanted contour corresponding to the arm member, and wherein when the second rail is moved along an opposite direction with respect to the first rail and drives the slanted section to contact the arm member, the inclining portion of the engaging member is pressed so that the contact portion of the engaging member is allowed to pass the arm member.

7. The slide rail assembly as claimed in claim 1, wherein the arm member includes an arm hole, wherein the blocking portion is an edge adjacent to the arm hole, wherein the contact portion of the engaging member is a protrusion, and wherein when the second rail is pulled and moved along the direction with respect to the first rail to the predetermined position, the protrusion of the engaging member is located at the arm hole of the arm member and is blocked by the edge of the arm member to block the second rail at the predetermined position.

8. A slide rail assembly, mounted to a rack by means of at least one bracket assembly, wherein the rack includes a post hole and the bracket assembly includes a side plate, an end plate bending from the side plate, and a mounting member connected to the end plate and mounted to the post hole of the rack, the slide rail assembly comprising:
a first rail, connected to the side plate of the bracket assembly and including an end;
a second rail, longitudinally and movably connected to the first rail;

an arm member, movably connected to the end of the first rail and including a blocking portion; and an engaging member, connected to the second rail and including a contact portion, wherein when the second rail is pulled and moved along a direction with respect to the first rail to a predetermined position, the blocking portion of the arm member blocks the contact portion of the engaging member so that the second rail is blocked at the predetermined position;

wherein the engaging member includes a base plate connected to the second rail and an inclining portion bending from the base plate, the contact portion being located on the inclining portion, and when the second rail is blocked at the predetermined position, the inclining portion being pressed to separate the contact portion of the engaging member from the blocking portion of the arm member;

wherein the second rail includes a rail hole and a hole edge adjacent to the rail hole, the engaging member further including a supporting portion connected to the inclining portion and bent towards the second rail, and the supporting portion including a blocking wing penetrating the rail hole and blocked by the hole edge.

9. The slide rail assembly as claimed in claim 8, wherein the first rail includes a base, and wherein a connection member pivotally connects the arm member to the base of the first rail.

10. A slide rail assembly for a bracket assembly, wherein the bracket assembly includes a side plate and an aim member, the arm member connected to the side plate and including a blocking portion, the slide rail assembly comprising:

a first rail, connected to the side plate of the bracket assembly;

a second rail, longitudinally and movably connected to the first rail; and an engaging member, connected to the second rail and including a contact portion, wherein when the second rail is pulled and moved along a direction with respect to the first rail to a predetermined position, the blocking portion of the arm member blocks the contact portion of the engaging member so that the second rail is blocked at the predetermined position;

wherein the engaging member includes a base plate connected to the second rail and an inclining portion bending from the base plate, and the contact portion being located on the inclining portion, and while the second rail is located at the predetermined position, the contact portion of the engaging member is no longer blocked by the blocking portion of the arm member once the inclining portion is pressed;

wherein the second rail includes a rail hole and a hole edge adjacent to the rail hole, wherein the engaging member includes a supporting portion connected to the inclining portion and bent towards the second rail, and wherein the supporting portion includes a blocking wing penetrating the rail hole and blocked by the hole edge.

11. The slide rail assembly as claimed in claim 10, wherein the side plate of the bracket assembly includes a base, wherein the bracket assembly includes a connection member, and wherein the connection member pivotally connects the arm member to the base of the side plate.

12. The slide rail assembly as claimed in claim 10, wherein the bracket assembly includes an end plate bending from the side plate, and wherein the location of the blocking portion of the bracket assembly extends beyond the end plate by a distance.

13. The slide rail assembly as claimed in claim 10, wherein the first rail includes an end, and wherein the side plate of the bracket assembly is connected to the end of the first rail.

14. The slide rail assembly as claimed in claim 10, wherein a section of the contact portion has a slanted contour corresponding to the arm member, and wherein when the second rail is moved along an opposite direction with respect to the first rail and drives the slanted section to contact the arm member, the inclining portion of the engaging member is pressed so that the contact portion of the engaging member is allowed to pass the arm member.

15. The slide rail assembly as claimed in claim 10, wherein the arm member includes an arm hole, wherein the blocking portion is an edge adjacent to the arm hole, wherein the contact portion of the engaging member is a protrusion, and wherein when the second rail is pulled and moved along the direction with respect to the first rail to the predetermined position, the protrusion of the engaging member is located at the arm hole of the arm member and is blocked by the edge of the arm member to block the second rail at the predetermined position.

* * * * *